(12) United States Patent
Long

(10) Patent No.: US 11,086,461 B2
(45) Date of Patent: Aug. 10, 2021

(54) ARRAY SUBSTRATE, EMBEDDED TOUCH SCREEN, AND DISPLAY DEVICE

(71) Applicant: BOE TECHNOLOGY GROUP CO., LTD., Beijing (CN)

(72) Inventor: Chunping Long, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/966,824

(22) PCT Filed: Dec. 9, 2019

(86) PCT No.: PCT/CN2019/124130
§ 371 (c)(1),
(2) Date: Jul. 31, 2020

(87) PCT Pub. No.: WO2020/140699
PCT Pub. Date: Jul. 9, 2020

(65) Prior Publication Data
US 2021/0055831 A1  Feb. 25, 2021

(30) Foreign Application Priority Data

Jan. 2, 2019 (CN) .......................... 201920004060.9
Jan. 2, 2019 (CN) .......................... 201920005316.8

(51) Int. Cl.
*G06F 3/041* (2006.01)
*G06F 3/044* (2006.01)
*H01L 27/12* (2006.01)

(52) U.S. Cl.
CPC .......... *G06F 3/0445* (2019.05); *G06F 3/0412* (2013.01); *H01L 27/124* (2013.01)

(58) Field of Classification Search
CPC ........ G06F 3/041; G06F 3/0412; G06F 3/044; G06F 3/0445; H01L 27/124
See application file for complete search history.

(56) References Cited

U.S. PATENT DOCUMENTS

2010/0194697 A1* 8/2010 Hotelling .............. G06F 3/0446
345/173
2012/0229395 A1* 9/2012 Shin ...................... G06F 3/0446
345/173
(Continued)

FOREIGN PATENT DOCUMENTS

CN 103700694 A 4/2014
CN 104022127 A 9/2014
(Continued)

*Primary Examiner* — Joe H Cheng
(74) *Attorney, Agent, or Firm* — Arent Fox LLP; Michael Fainberg

(57) ABSTRACT

An array substrate, an embedded touch screen, and a display device. The array substrate comprises a base substrate, a touch electrode line located above the base substrate, a touch electrode located above the touch electrode line, and a first insulating layer located between the touch electrode line and the touch electrode. The touch electrode line has a groove portion, the first insulating layer has a via hole, and a connecting portion of the touch electrode extends into the groove portion through the via hole, so as to be electrically connected to the touch electrode line.

20 Claims, 9 Drawing Sheets

(56) References Cited

U.S. PATENT DOCUMENTS

| | | | | |
|---|---|---|---|---|
| 2013/0162570 A1* | 6/2013 | Shin | ............... | G02F 1/133345 |
| | | | | 345/173 |
| 2013/0257794 A1* | 10/2013 | Lee | ............... | G02F 1/13338 |
| | | | | 345/174 |
| 2014/0168149 A1* | 6/2014 | Han | ............... | G06F 3/0412 |
| | | | | 345/174 |
| 2014/0168150 A1* | 6/2014 | Kim | ............... | G06F 3/0412 |
| | | | | 345/174 |
| 2014/0168537 A1* | 6/2014 | Han | ............... | G06F 3/0446 |
| | | | | 349/12 |
| 2016/0187693 A1* | 6/2016 | Woo | ............... | G02F 1/13338 |
| | | | | 257/72 |
| 2016/0294386 A1 | 10/2016 | Yang et al. | | |
| 2016/0299612 A1* | 10/2016 | Lu | ............... | G06F 3/0412 |
| 2017/0205953 A1 | 7/2017 | Sun et al. | | |
| 2018/0373079 A1* | 12/2018 | Yeh | ............... | G02F 1/13338 |
| 2019/0018522 A1* | 1/2019 | Kim | ............... | G02F 1/1368 |
| 2019/0294273 A1* | 9/2019 | Yoshida | ............... | G06F 3/0418 |
| 2020/0089038 A1* | 3/2020 | Yoshino | ............... | G02F 1/136 |
| 2020/0124901 A1* | 4/2020 | Li | ............... | G06F 3/0412 |

FOREIGN PATENT DOCUMENTS

| | | |
|---|---|---|
| CN | 106020581 A | 10/2016 |
| CN | 106055160 A | 10/2016 |
| CN | 209044564 U | 6/2019 |
| CN | 209118253 U | 7/2019 |

\* cited by examiner

ARRAY SUBSTRATE, EMBEDDED TOUCH SCREEN, AND DISPLAY DEVICE

CROSS REFERENCE TO RELATED APPLICATIONS

The present disclosure is a National Stage of International Application No. PCT/CN2019/124130, filed on Dec. 9, 2019, which claims priorities of the Chinese Patent Application No. 201920004060.9, filed on Jan. 2, 2019 to the Patent Office of the People's Republic of China and entitled "Array Substrate, Embedded touch screen and Display Device" and the Chinese Patent Application No. 201920005316.8, filed on Jan. 2, 2019 to the Patent Office of the People's Republic of China and entitled "Array Substrate, Embedded touch screen and Display Device", the entire contents of which are incorporated herein by reference.

FIELD

The present disclosure relates to the field of display technology, and in particular to an array substrate, an embedded touch screen and a display device.

BACKGROUND

At present, the existing embedded touch screen uses the principle of mutual capacitance or self-capacitance to detect the touch position of the finger. Between them, by using the principle of self-capacitance, a plurality of self-capacitance electrodes located on the same layer and insulated from one another can be located in the touch screen. When the human body does not touch the screen, the capacitance borne by each self-capacitance electrode is a fixed value. When the human body touches the screen, the capacitance borne by the corresponding self-capacitance electrode is the sum of the fixed value and the human body capacitance. A touch detection chip can determine the touch position by detecting the change in the capacitance value of each self-capacitance electrode during the touch period. Since the human body capacitance can act on all self-capacitance, compared to the fact that the human body capacitance can only act on the projected capacitance in the mutual capacitance, the touch change caused by the human body touching the screen will be greater than that of the touch screen made by the principle of mutual capacitance, so the signal-to-noise ratio of touch can be effectively improved as compared to the mutual-capacitance touch screen, thereby improving the accuracy of touch sensing.

SUMMARY

Embodiments of the present disclosure provide an array substrate, including:
a base substrate;
a touch electrode line located above the base substrate, wherein the touch electrode line includes a groove portion;
a first insulating layer located on the touch electrode line, wherein the first insulating layer includes a via hole; and
a touch electrode located on the first insulating layer, wherein the touch electrode includes a connecting portion, and the connecting portion extends into the groove portion through the via hole and is electrically connected to the touch electrode line.

Optionally, in the above array substrate provided by some embodiments of the present disclosure, the connecting portion and a side wall of the groove portion are separated by the first insulating layer, and the connecting portion is electrically connected to a bottom of the groove portion.

Optionally, in the above array substrate provided by some embodiments of the present disclosure, the array substrate further includes: a second insulating layer located under the touch electrode line, wherein the second insulating layer includes a groove structure, and a depth of the groove structure is greater than a thickness of the touch electrode line; and the groove portion of the touch electrode line is located in the groove structure.

Optionally, in the above array substrate provided by some embodiments of the present disclosure, the array substrate further includes a thin film transistor located between the second insulating layer and the base substrate, wherein the second insulating layer is a planarization layer.

Optionally, in the above array substrate provided by some embodiments of the present disclosure, the first insulating layer includes a first passivation layer located on one side of the touch electrode line facing the touch electrode, and a second passivation layer located between the first passivation layer and the touch electrode.

Optionally, in the above array substrate provided by some embodiments of the present disclosure, the array substrate further includes: a third passivation layer, wherein the third passivation layer is located between the second insulating layer and the thin film transistor.

Optionally, in the above array substrate provided by some embodiments of the present disclosure, the second insulating layer further includes a fourth passivation layer, wherein the fourth passivation layer is located between the planarization layer and the touch electrode line.

Optionally, in the above array substrate provided by some embodiments of the present disclosure, the array substrate further includes a thin film transistor located between the first insulating layer and the base substrate, wherein the touch electrode line is located on a layer same as a layer on which a source and a drain of the thin film transistor are, and the second insulating layer is an interlayer insulating layer between the source and the drain of the thin film transistor and a gate of the thin film transistor.

Optionally, in the above array substrate provided by some embodiments of the present disclosure, the first insulating layer includes a first passivation layer, a planarization layer and a second passivation layer that are stacked sequentially between the touch electrode line and the touch electrode.

Optionally, in the above array substrate provided by some embodiments of the present disclosure, the array substrate further includes a common electrode layer, wherein the common electrode layer includes a plurality of independent common electrodes, and the common electrode is reused as the touch electrode.

Optionally, in the above array substrate provided by some embodiments of the present disclosure, the array substrate further includes a pixel electrode located between the common electrode layer and the touch electrode line, and a lap portions located in the via hole and electrically connected to the connecting portion of the touch electrode; and the lap portion is located on a layer same as a layer on which the pixel electrode is.

Optionally, in the above array substrate provided by some embodiments of the present disclosure, a material of the interlayer insulating layer includes $SiO_2$ and SiN, and a thickness of the interlayer insulating layer is 200 nm-700 nm.

Optionally, in the above array substrate provided by some embodiments of the present disclosure, a material of the planarization layer is an organic insulating material, and a thickness of the planarization layer is 600 nm-1800 nm.

Optionally, in the above array substrate provided by some embodiments of the present disclosure, a material of the first passivation layer includes SiN, and a thickness of the first passivation layer is 100 nm-400 nm.

Optionally, in the above array substrate provided by some embodiments of the present disclosure, the touch electrode line includes a plurality of groove portions, and the touch electrode includes a plurality of connecting portions matched with the number of the groove portions.

Optionally, in the above array substrate provided by some embodiments of the present disclosure, the touch electrode is electrically connected to at least two touch electrode lines.

Optionally, in the above array substrate provided by some embodiments of the present disclosure, the touch electrode lines electrically connected to the touch electrode are electrically connected to one another at a signal input terminal through a touch electrode lead.

Optionally, in the above array substrate provided by some embodiments of the present disclosure, the touch electrode lines electrically connected to the touch electrode are electrically connected to one another at the other end away from the signal input terminal through a connecting line.

Optionally, in the above array substrate provided by some embodiments of the present disclosure, the array substrate further includes: auxiliary electrodes located on a layer same as a layer on which the touch electrode lines are, and a plurality of sub-pixel units arranged in an array, wherein the auxiliary electrodes and the touch electrode lines extend in a same direction;

wherein the auxiliary electrodes are electrically connected to the touch electrode, and the auxiliary electrodes and the touch electrode lines are located at gaps among different sub-pixel units.

Optionally, in the above array substrate provided by some embodiments of the present disclosure, the touch electrode lines and the auxiliary electrodes electrically connected to the touch electrode are arranged alternately.

Optionally, in the above array substrate provided by some embodiments of the present disclosure, the array substrate further includes a data line, wherein the touch electrode lines and the data line are located on different layers;

orthographic projections of the touch electrode line and the data line located at a same gap between the sub-pixel units on the base substrate at least partially overlap; and orthographic projections of the auxiliary electrode and the data line located at a same gap between the same sub-pixel units on the base substrate at least partially overlap.

Optionally, in the above array substrate provided by some embodiments of the present disclosure, the array substrate further includes a plurality of data lines, wherein the touch electrode lines and the data lines are located on the same layer;

orthographic projections of the touch electrode line and the data line located at a same gap between the sub-pixel units on the base substrate do not overlap with each other; and orthographic projections of the auxiliary electrode and the data line located at a same gap between the sub-pixel units on the base substrate do not overlap with each other.

Accordingly, an embodiment of the present disclosure further provides an embedded touch screen, including the above array substrate provided by some embodiments of the present disclosure.

Accordingly, an embodiment of the present disclosure further provides a display device, including the above embedded touch screen provided by the embodiment of the present disclosure.

DETAILED DESCRIPTION OF THE EMBODIMENTS

Figure 1:
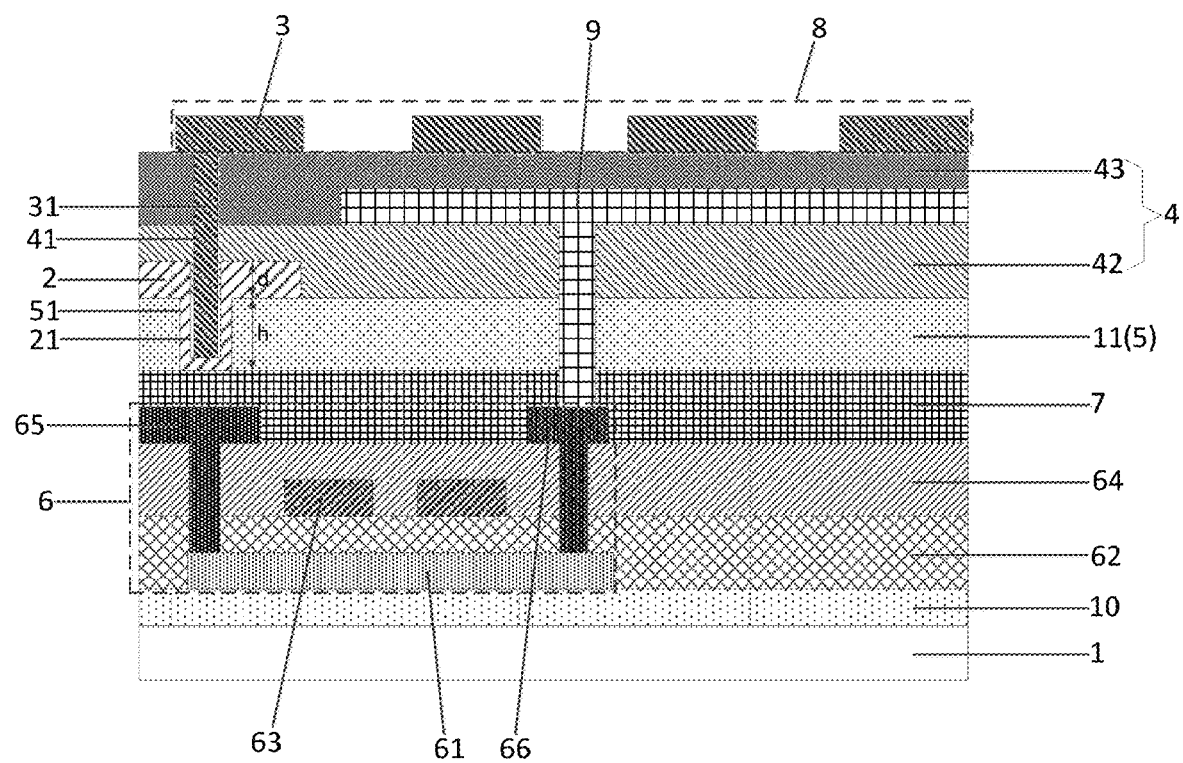
FIG. 1 is a structural schematic diagram of an array substrate provided by some embodiments of the present disclosure.

In order to make the objectives, technical solutions and advantages of the present disclosure more clear, specific implementations of the array substrate, the embedded touch screen and the display device provided by some embodiments of the present disclosure will be described in detail below in conjunction with the drawings.

The thickness and shape of each thin film in the drawings do not reflect the true proportions of the array substrate, and are merely intended to illustrate the present disclosure.

An array substrate provided by some embodiments of the present disclosure, as shown in FIGS. 1 to 5, includes a base substrate 1, a touch electrode line 2 located above the base substrate 1, a touch electrode 3 located above the touch electrode line 2, and a first insulating layer 4 located between the touch electrode line 2 and the touch electrode 3; wherein the touch electrode line 2 has a groove portion 21, the first insulating layer 4 has a via hole 41, the touch electrode 3 has a connecting portion 31, and the connecting portion 31 extend into the groove portion 21 through the via hole 41 and is electrically connected to the touch electrode line 2.

According to the array substrate provided by some embodiments of the present disclosure, by setting the touch electrode line 2 as a structure having the groove portion 21, the touch electrode 3 is electrically connected to the groove portion 21 of the touch electrode line 2 through the connecting portion 31, so that electrical connection joins of the touch electrode 3 and the touch electrode line 2 is further away from a surface of the touch electrode 3, which can increase a distance between the touch electrode 3 and the electrical connection joint and thus reduce the influence of the electrical connection on the touch electrode 3, thereby being beneficial to reducing the noise and improving the signal-to-noise ratio and the touch sensitivity of the touch electrode 3.

Figure 3:
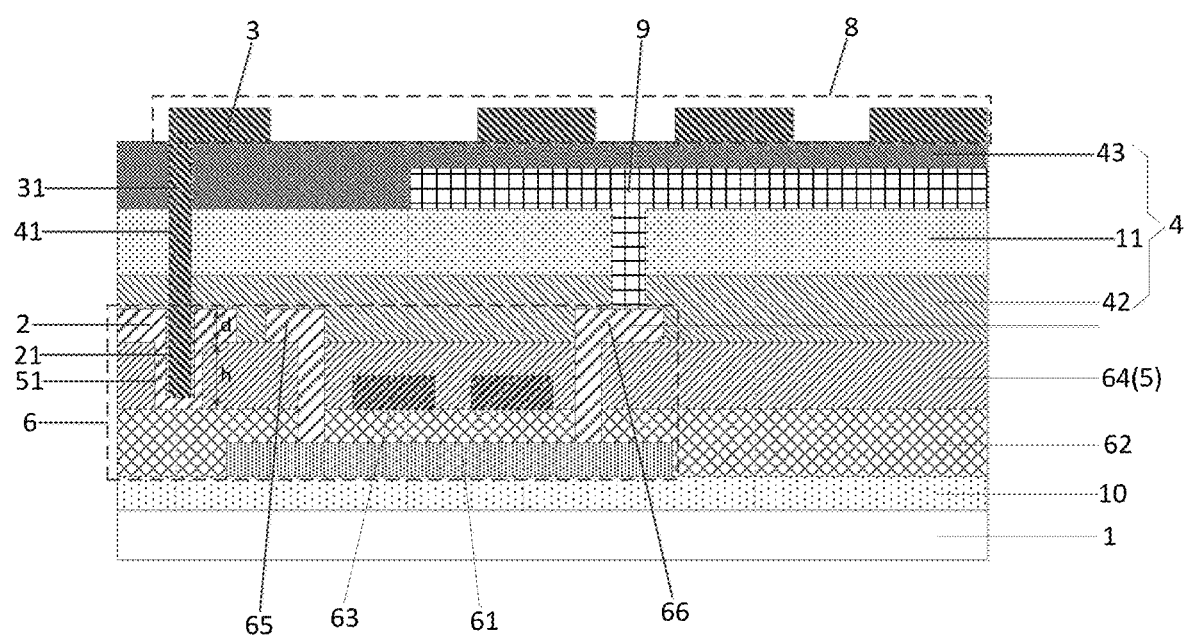
FIG. 3 is another structural schematic diagram of an array substrate provided by some embodiments of the present disclosure.

Optionally, in the above array substrate provided by some embodiments of the present disclosure, as shown in FIG. 1 and FIG. 3, the connecting portion 31 and a side wall of the groove portion 21 may be separated by the first insulating layer 4, that is, the connecting portion 31 is insulated from the touch electrode line 2 at the side wall of the groove portion 21, and the connecting portion 31 is electrically connected to the bottom of the groove portion 21, so that the electrical connection joints of the touch electrode 3 and the touch electrode lines 2 are further away from the surface of the touch electrode 3, which can increase the distance between the touch electrode 3 and the electrical connection joints and thus reduce the influence of the electrical connection on the touch electrode 3, thereby being beneficial to reducing the noise and improving the signal-to-noise ratio and the touch sensitivity of the touch electrode 3.

Optionally, in the above array substrate provided by some embodiments of the present disclosure, as shown in FIG. 1 to FIG. 5, the array substrate may further include: a second insulating layer 5 located under the touch electrode line 2. The second insulating layer 5 has a groove structure 51, and the depth h of the groove structure 51 is greater than the thickness d of the touch electrode line 2 to ensure that the groove portion 21 of the touch electrode line 2 is located in the groove structure 51. By disposing the groove structure 51 in the second insulating layer 5, the structure of the groove portion 21 of the touch electrode line 2 can be realized.

Optionally, in the above array substrate provided by some embodiments of the present disclosure, as shown in FIG. 1 to FIG. 5, the array substrate may further include a common electrode layer 8 having a plurality of independent common electrodes, and the common electrode may be reused as the touch electrode 3. Moreover, a common electrode line may be reused as the touch electrode line 2, which can reduce the manufacture of the touch electrode 3 and reduce the thickness of the embedded touch screen where the array substrate provided by some embodiments of the present disclosure is located.

Figure 2:
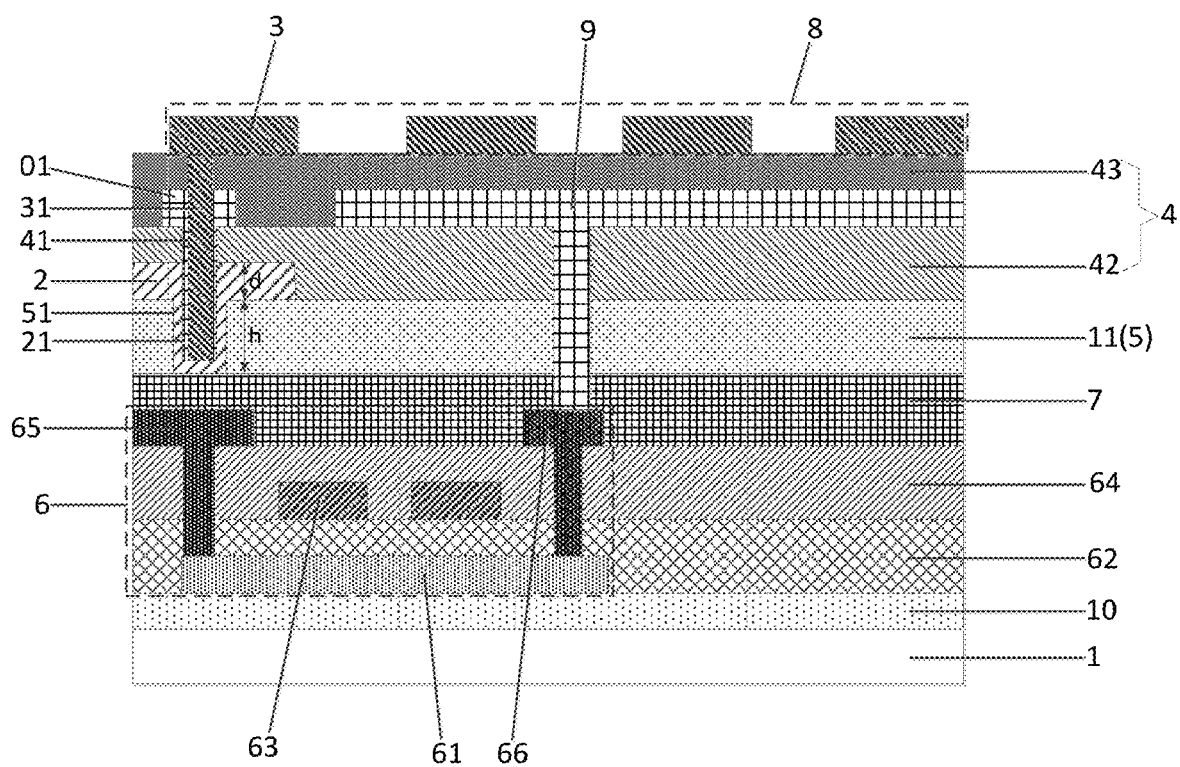
FIG. 2 is another structural schematic diagram of an array substrate provided by some embodiments of the present disclosure.
Figure 4:
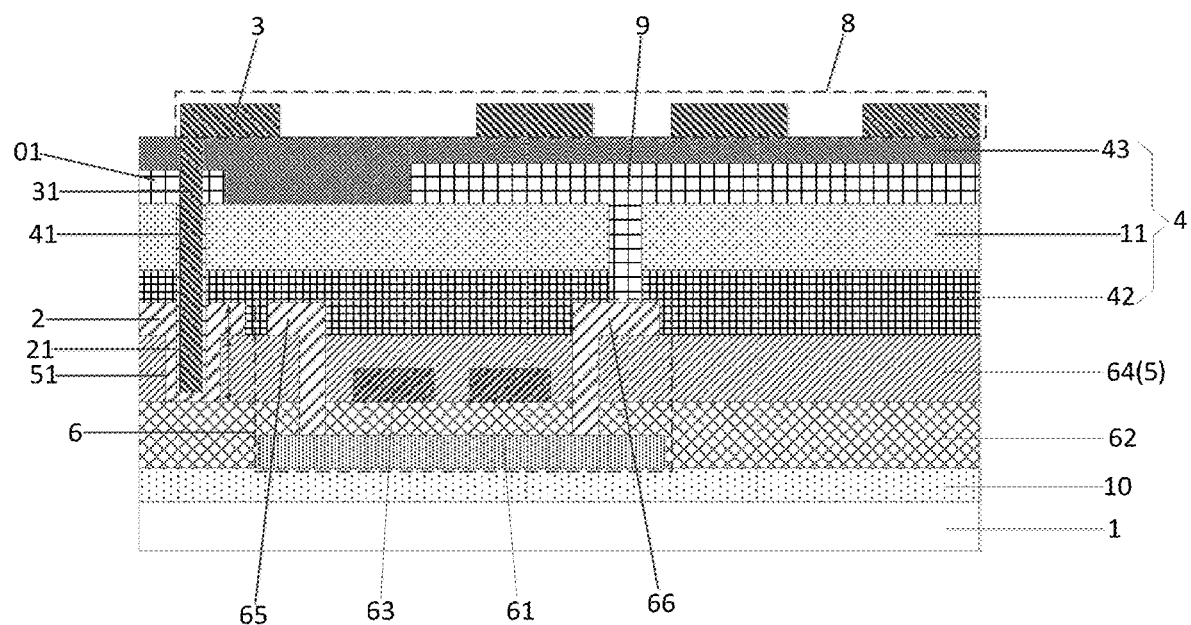
FIG. 4 is another structural schematic diagram of an array substrate provided by some embodiments of the present disclosure.

Optionally, in the above array substrate provided by some embodiments of the present disclosure, as shown in FIG. 2 and FIG. 4, the array substrate may further include a pixel electrode 9 located between the common electrode layer 8 and the touch electrode line 2, and a lap portion 01 located in the via hole 41 and electrically connected to the connecting portion 31 of the touch electrode 3; and the lap portion 01 is located on the same layer as the pixel electrodes 9. Thus, as long as the original composition pattern is changed when the pixel electrode 9 is formed, the pattern of the lap portion 01 and the pixel electrode 9 can be formed by a single composition technique without adding a separate technique for preparing the lap portion 01, which can simplify the preparation technical process, save the production cost and improve the production efficiency.

By manufacturing the lap portion 01 electrically connected to the connecting portion 31 of the touch electrode 3 in the via hole 41, the segment gap of the connecting portion 31 can be reduced, and the increase in the thickness of the connecting portion 31 can reduce the connection resistance, so that the influence of the electrical connection on the touch electrode 3 is further reduced, thereby further improving the touch sensitivity of the touch electrode 3.

Optionally, in the above array substrate provided by some embodiments of the present disclosure, as shown in FIG. 1 and FIG. 2, the array substrate may further include thin film transistors 6 located between the second insulating layer 5 and the base substrate 1, wherein the second insulating layer 5 includes a planarization layer 11. That is, the thin film transistors 6 are located below the film layer where the touch electrode lines 2 are located.

Optionally, in the above array substrate provided by some embodiments of the present disclosure, as shown in FIG. 1 and FIG. 2, the first insulating layer 4 may include a first passivation layer 42 located on one side of the touch electrode line 2 facing the touch electrode 3, and a second passivation layer 43 located between the first passivation layer 42 and the touch electrode 3. The pixel electrode 9 is located between the first passivation layer 42 and the second passivation layer 43, the pixel electrode 9 is insulated from the touch electrode line 2 by the first passivation layer 42, and the pixel electrode 9 is insulated from the touch electrode 3 by the second passivation layer 43.

Optionally, in the above array substrate provided by some embodiments of the present disclosure, as shown in FIG. 1, the array substrate may further include a third passivation layer 7 located between the planarization layer 11 (that is, the second insulating layer 5) and the thin film transistors 6. That is, after the thin film transistor 6 is manufactured in the present disclosure, in order to protect the thin film transistor 6 from damage by subsequent manufacturing techniques, the third passivation layer 7 is manufactured on the thin film transistor 6, and in order to ensure the uniformity of the thickness of each film layer of the array substrate, it is also necessary to manufacture the planarization layer 11, that is, the second insulating layer 5. Moreover, by manufacturing the groove structure 51 in the planarization layer 11, the touch electrode line 2 can fall into the groove structure 51 during the manufacture of the touch electrode line 2, so that the touch electrode line 2 has the groove portion 21. Thus, when the touch electrode line is electrically connected to the touch electrode 3 subsequently, the touch electrode 3 can be electrically connected to the groove portion 21 of the touch electrode line 2 by the connecting portion 31, so that the electrical connection joints of the touch electrode 3 and the touch electrode line 2 are further away from the surface of the touch electrode 3, which can increase the distance between the touch electrode 3 and the electrical connection joints and thus reduce the influence of the electrical connection on the touch electrode 3, thereby being beneficial to reducing the noise and improving the signal-to-noise ratio and the touch sensitivity of the touch electrode 3.

Figure 5:
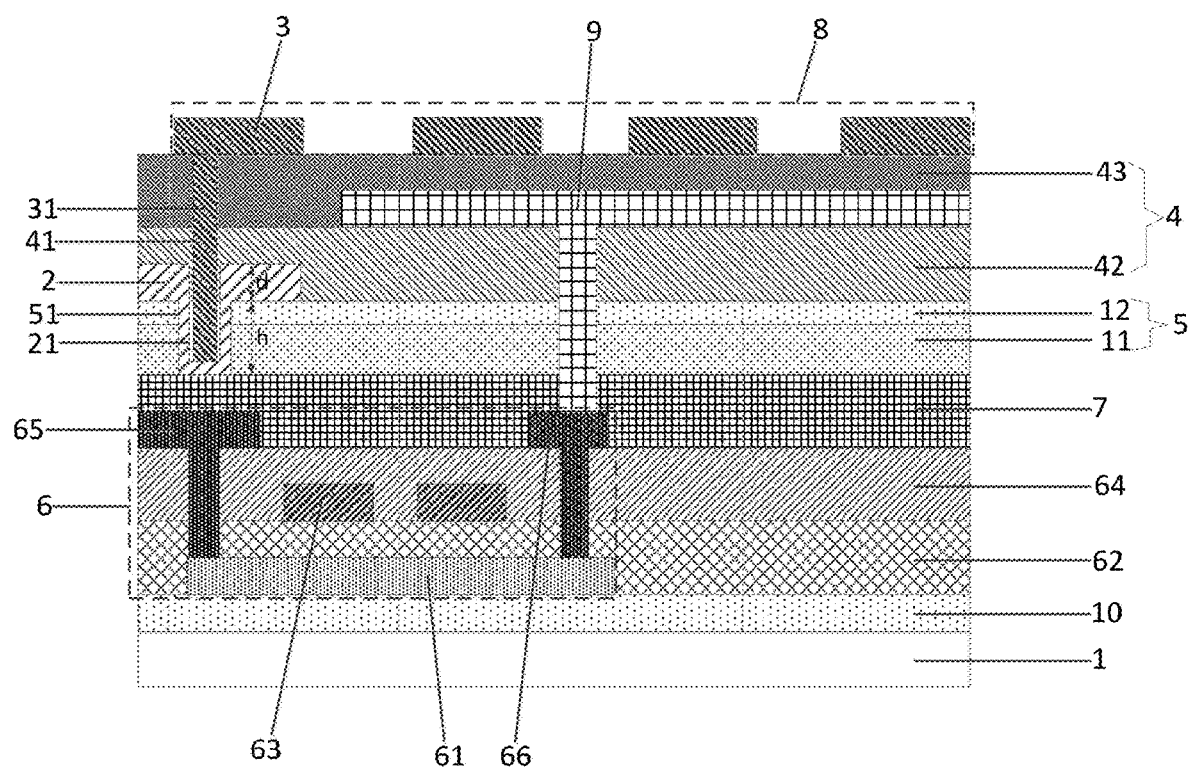
FIG. 5 is another structural schematic diagram of an array substrate provided by some embodiments of the present disclosure.

Optionally, in the above array substrate provided by some embodiments of the present disclosure, as shown in FIG. 5, the second insulating layer 5 may further include a fourth passivation layer 12, wherein the fourth passivation layer 12 is located between the planarization layer 11 and the touch electrode line 2. The presence of the fourth passivation layer 12 can increase the depth of the groove portion 21 of the touch electrode line 2, so that the electrical connection joints of the touch electrode 3 and the touch electrode line 2 are further away from the surface of the touch electrode 3, which increases the distance between the touch electrode 3 and the electrical connection joints and thus reduces the influence of the electrical connection on the touch electrode 3, thereby being beneficial to reducing the noise and improving the signal-to-noise ratio and the touch sensitivity of the touch electrode 3.

Optionally, in the above array substrate provided by some embodiments of the present disclosure, as shown in FIG. 1 to FIG. 5, the array substrate may further include a buffer layer 10 located between the base substrate 1 and the thin film transistor 6. The thin film transistor 6 includes an active layer 61, a gate insulating layer 62, a gate 63, an interlayer insulating layer 64, a source 65 and a drain 66 that are stacked sequentially. These film layers are the same as those in the related art and will not be described in detail here. Moreover, in FIG. 1 to FIG. 5, the thin film transistor 6 having two gates 63 is taken an example for description. In actual application, the number of the gates 63 is not limited.

Optionally, in the above array substrate provided by some embodiments of the present disclosure, the touch electrode line 2 may be located at a certain conductive film layer of the thin film transistor 6. For example, as shown in FIG. 3 and FIG. 4, the thin film transistor 6 may be located between the first insulating layer 4 and the base substrate, and the touch electrode line 2 is located on the same layer as the source and the drain (65 and 66) of the thin film transistor 6. Thus, as long as the original composition pattern is changed when the source and the drain (65 and 66) are formed, the pattern of the touch electrode line 2 and the source and the drain (65 and 66) can be formed by a single composition technique without adding a separate technique for preparing the touch electrode line 2, which can simplify the preparation technical process, save the production cost and improve the production efficiency. The second insulating layer 5 may be the interlayer insulating layer 64 between the source and the drain of the thin film transistor 6 and the gates 63 of the thin film transistor 6.

Optionally, as shown in FIG. 3 and FIG. 4, when the interlayer insulating layer 64 is manufactured in the present disclosure, by manufacturing the groove structure 51 in the interlayer insulating layer 64, the touch electrode line 2 can fall into the groove structures 51 during the manufacture of the touch electrode line 2, so that the touch electrode line 2 has the groove portion 21. Thus, when the touch electrode line is electrically connected to the touch electrode 3 subsequently, the touch electrode 3 can be electrically connected to the groove portions 21 of the touch electrode line 2 by the connecting portion 31, so that the electrical connection joints of the touch electrode 3 and the touch electrode line 2 are further away from the surface of the touch electrode 3, which can increase the distance between the touch electrode 3 and the electrical connection joints and thus reduce the influence of the electrical connection on the touch electrode 3, thereby being beneficial to reducing the noise and improving the signal-to-noise ratio and the touch sensitivity of the touch electrode 3.

Optionally, in the above array substrate provided by some embodiments of the present disclosure, a material of the interlayer insulating layer 64 may include $SiO_2$ and SiN, and the thickness of the interlayer insulating layer may be 200 nm-700 nm, which is not limited herein.

Optionally, in the above array substrate provided by some embodiments of the present disclosure, the thickness of the interlayer insulating layer 64 may be 450 nm, and the thin film transistor 6 with this thickness has better performance.

Optionally, in the above array substrate provided by some embodiments of the present disclosure, as shown in FIG. 3 and FIG. 4, the first insulating layer 4 may include a first passivation layer 42, a planarization layer 11 and a second passivation layer 43 that are located between the touch electrode line 2 and the touch electrode 3 and stacked sequentially. The pixel electrode 9 is located between the second passivation layer 43 and the planarization layer 11, the pixel electrode 9 is insulated from the touch electrode line 2 by the first passivation layer 42 and the planarization layer 11, and the pixel electrode 9 is insulated from the touch electrode 3 by the second passivation layer 43.

Optionally, in the above array substrate provided by some embodiments of the present disclosure, a material of the planarization layer 11 may be an organic insulating material, and the thickness of the planarization layer 11 may be 600 nm-1800 nm.

Optionally, in the above array substrate provided by some embodiments of the present disclosure, the thickness of the planarization layer 11 may be 1200 nm, and the thin film transistor 6 with this thickness has better performance.

Optionally, in the above array substrate provided by some embodiments of the present disclosure, a material of the first passivation layer 42 may include SiN, and the thickness of the first passivation layer 42 may be 100 nm-400 nm.

Optionally, in the above array substrate provided by some embodiments of the present disclosure, the thickness of the first passivation layer 42 may be 250 nm, and the thin film transistor 6 with this thickness has better performance.

Figure 6:
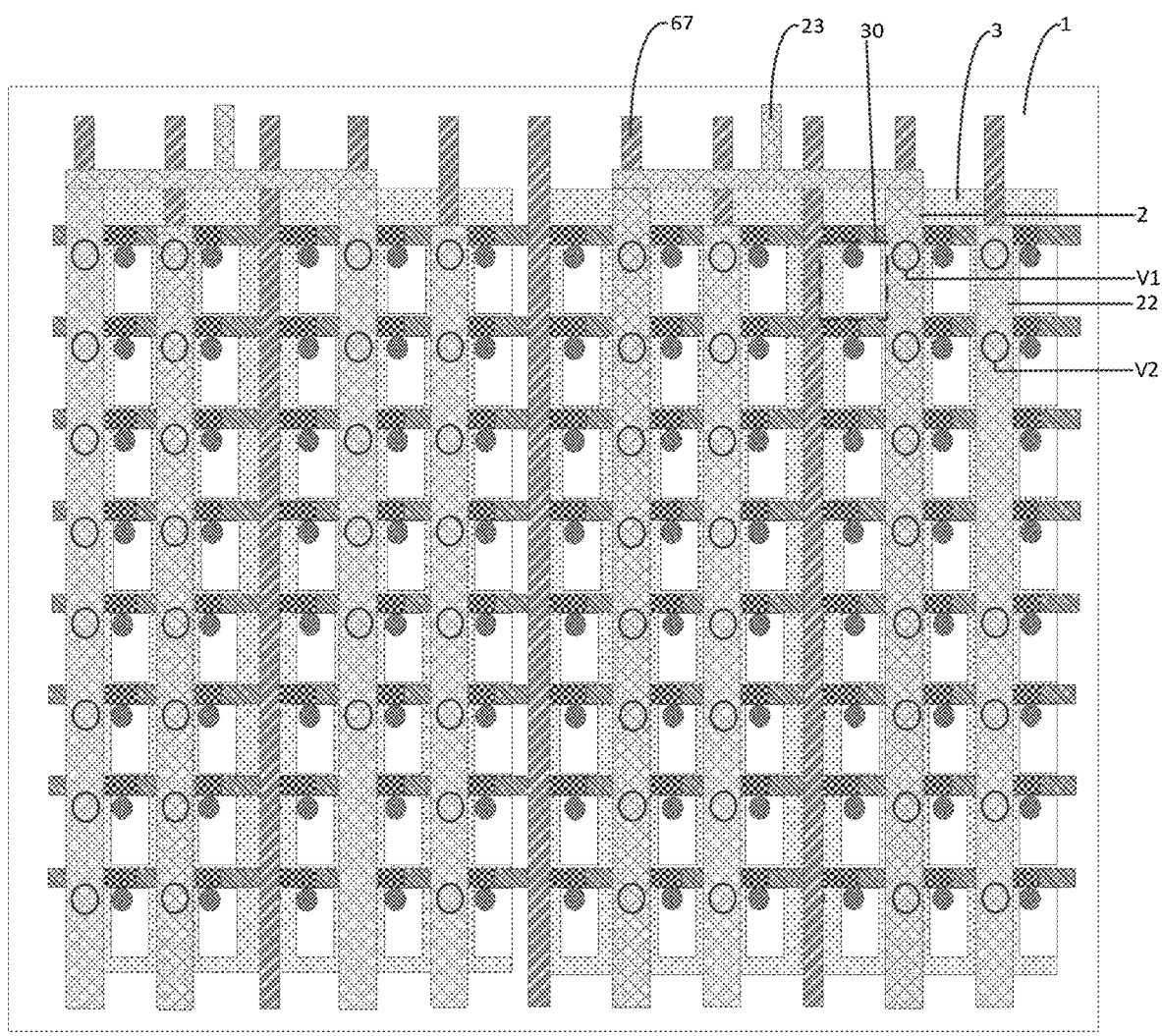
FIG. 6 is another structural schematic diagram of an array substrate provided by some embodiments of the present disclosure.
Figure 7:
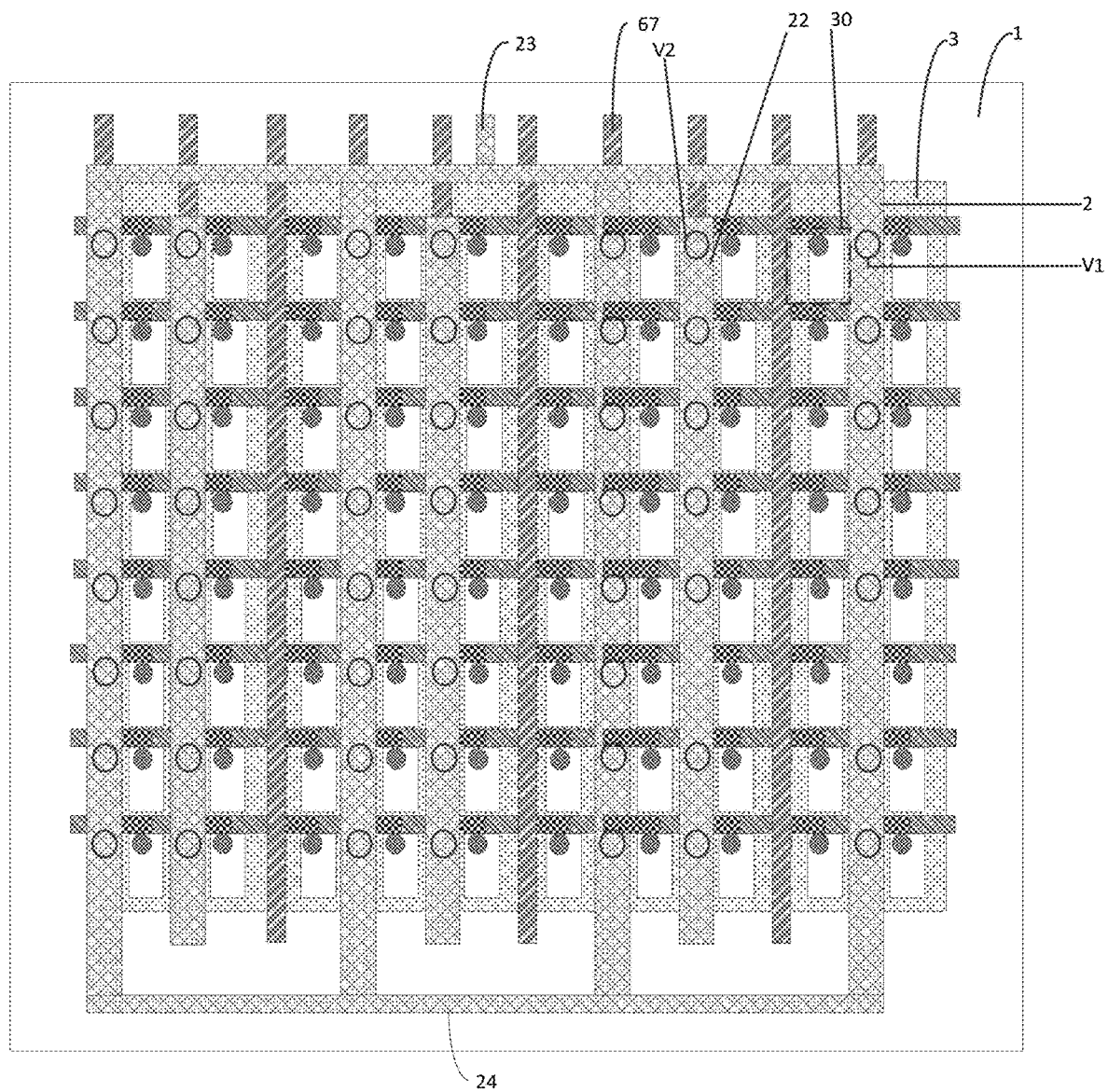
FIG. 7 is another structural schematic diagram of an array substrate provided by some embodiments of the present disclosure.
Figure 8:
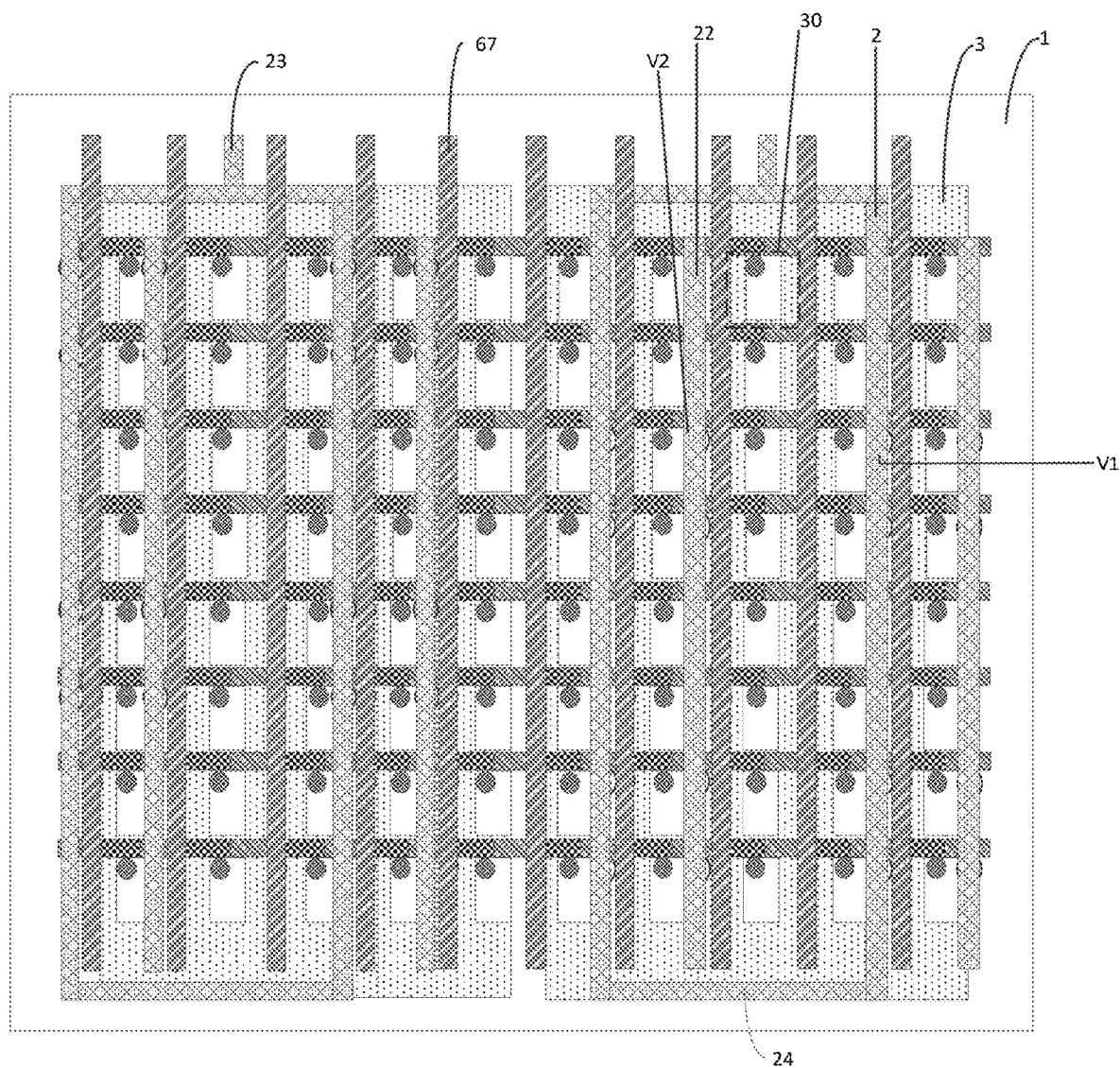
FIG. 8 is another structural schematic diagram of an array substrate provided by some embodiments of the present disclosure.

Optionally, in the above array substrate provided by some embodiments of the present disclosure, as shown in FIG. 6 to FIG. 8, each touch electrode line 2 has a plurality of groove portions 21, and the touch electrode 3 has a plurality of connecting portions 31 matched with the number of the groove portions 21. That is, each touch electrode line 2 is electrically connected to the touch electrode 3 by a plurality of first connection points V1, so that the contact resistance of the touch electrode 3 can be reduced, thereby reducing the noise, improving the signal-to-noise ratio of touch and further improving the sensitivity of touch.

Optionally, in the above array substrate provided by some embodiments of the present disclosure, as shown in FIG. 6 to FIG. 8, each touch electrode 3 may be electrically connected to at least two touch electrode lines 2. Thus, when one of the touch electrode lines 2 is broken or short-circuited, signals can also be transmitted through the other touch electrode lines 2, thereby improving the reliability of touch. It should be noted that in FIG. 6 and FIG. 8, two touch electrodes 3, each of which is electrically connected to two touch electrode lines 2, are taken as an example for description; and in FIG. 7, one touch electrode 3 being electrically connected to four touch electrode lines 2 is taken as an example for description. In specific implementation, as long as each touch electrode 3 is electrically connected to at least two touch electrode lines 2, it belongs to the protection scope of the present disclosure, which is not limited herein.

Optionally, in the above array substrate provided by some embodiments of the present disclosure, as shown in FIG. 6, the touch electrode lines 2 electrically connected to the same touch electrode 3 may be electrically connected to one another at a signal input terminal through a touch electrode lead 23. The signal input terminal refers to the terminal connected to a driver chip.

Optionally, in the above array substrate provided by some embodiments of the present disclosure, as shown in FIG. 7 and FIG. 8, the touch electrode lines 2 electrically connected to the same touch electrode 3 may also be electrically connected to one another at the other terminal away from the signal input terminal through a connecting line 24. Thus, even if the touch electrode line 2 is broken or short-circuited at multiple positions, touch signals can be transmitted, thereby further improving the touch sensitivity.

Optionally, in the above array substrate provided by some embodiments of the present disclosure, as shown in FIG. 6 to FIG. 8, the array substrate may further include: an auxiliary electrode 22 located on the same layer as the touch electrode line 2 and extending in the same direction, and a plurality of sub-pixel units 30 arranged in an array. The auxiliary electrode 22 is electrically connected to the touch electrodes 3, and the auxiliary electrode 22 and the touch electrode line 2 are located at gaps among the different sub-pixel units 30. Optionally, by disposing the auxiliary electrode 22 electrically connected to the touch electrodes 3, the equivalent resistance of the auxiliary electrode 22 and the touch electrodes 3 electrically connected is less than the resistance of the touch electrodes 3 itself, so the resistance of the touch electrodes 3 can be effectively reduced, which can improve the touch sensitivity of the embedded touch screen. Moreover, the auxiliary electrode 22 may be electrically connected to the touch electrode 3 by a plurality of second connection points V2, so that the contact resistance of the touch electrode 3 can be further reduced, thereby reducing the noise, improving the signal-to-noise ratio of touch and further improving the sensitivity of touch.

Optionally, in the above array substrate provided by some embodiments of the present disclosure, as shown in FIG. 6 to FIG. 8, the touch electrode lines 2 and the auxiliary electrodes 22 electrically connected to the same touch electrode 3 may be arranged alternately. That is, one auxiliary electrode 22 may be located beside one touch electrode line 2 to avoid the blind touch areas and improve the uniformity of wiring of the array substrate.

Optionally, in the above array substrate provided by some embodiments of the present disclosure, as shown in FIG. 6 and FIG. 7, the array substrate may further include a data line 67, wherein the touch electrode line 2 and the data line 67 are located on different layers. Optionally, the data line 67 is generally located on the same film layer as the source 65 and the drain 66 of the thin film transistor 6. Orthographic projections of the touch electrode line 2 and the data line 67 located at a gap between the same sub-pixel units 30 on the base substrate 1 at least partially overlap; and orthographic projections of the auxiliary electrode 22 and the data line 67 located at the gap between the same sub-pixel units 30 on the base substrate 1 at least partially overlap.

It should be noted that, generally, the array substrate includes a plurality of pixel units, each pixel unit includes a plurality of sub-pixel units (for example, a red sub-pixel, a green sub-pixel and a blue sub-pixel), the sub-pixel units in each column are generally connected to one data line, and the sub-pixel units in each row are generally connected to one gate line, that is, a plurality of gate lines and a plurality of data lines intersect to define the plurality of sub-pixel units. Each sub-pixel unit includes a pixel electrode and a thin film transistor, a gate of the thin film transistor is connected to the grid line, a source of the thin film transistor is connected to the data line, and a drain of the thin film transistor is connected to the pixel electrode. These structures are the same as those in the related art and will not be described in detail here.

Thus, the touch electrode line 2 and the auxiliary electrode 22 are located at the gap between the different sub-pixel units 30 to avoid the blind touch areas caused by too much wiring in the same area and improve the sensitivity of touch. Moreover, the data line 67 and the touch electrode line 2 (or auxiliary electrode 22) located at the gap between the same sub-pixel units 30 are overlapped to improve the utilization ratio of the gap.

Optionally, in the above array substrate provided by some embodiments of the present disclosure, as shown in FIG. 8, the array substrate may further include a plurality of data lines 67, wherein the touch electrode line 2 and the data lines 67 are located on the same layer. Thus, as long as the original composition pattern is changed when the data lines 67 are formed, the pattern of the auxiliary electrode 22, the touch electrode line 2 and the data lines 67 can be formed by a single composition technique without adding a separate technique for preparing the auxiliary electrode 22 and the touch electrode line 2, which can simplify the preparation technical process, save the production cost and improve the production efficiency. The orthographic projections of the touch electrode line 2 and the data line 67 located at the gap between the same sub-pixel units 30 on the base substrate 1 do not overlap with each other, thereby avoiding the signal interference generated between the touch electrode line 2 and the data line 67 located on the same layer. The orthographic projections of the auxiliary electrode 22 and the data line 67 located at the gap between the same sub-pixel units 30 on the base substrate do not overlap with each other, thereby avoiding the signal interference generated between the auxiliary electrode 22 and the data line 67 located on the same layer.

Figure 9:
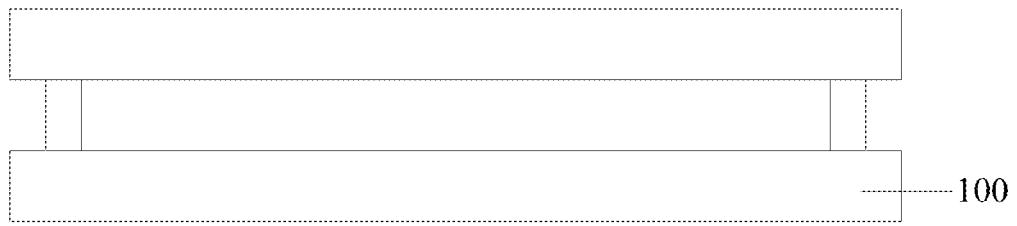
FIG. 9 is a structural schematic diagram of an embedded touch screen provided by the embodiment of the present disclosure.

Based on the same disclosed concept, an embodiment of the present disclosure further provides an embedded touch screen, as shown in FIG. 9, including any of the above array substrates 100 provided by some embodiments of the present disclosure. The principle of the embedded touch screen to solve the problems is similar to that of the aforementioned array substrate. Therefore, for the implementation of the embedded touch screen, reference may be made to the implementation of the aforementioned array substrate, and the repetition is not described here.

Based on the same disclosed concept, an embodiment of the present disclosure further provides a display device, including the above embedded touch screen provided by the embodiment of the present disclosure. The principle of the display device to solve the problems is similar to that of the aforementioned array substrate. Therefore, for the implementation of the display device, reference may be made to the implementation of the aforementioned array substrate, and the repetition is not described here.

In some embodiments, the above display device may be a full-screen display device, or may also be a flexible display device or the like, which is not limited herein.

Figure 10:
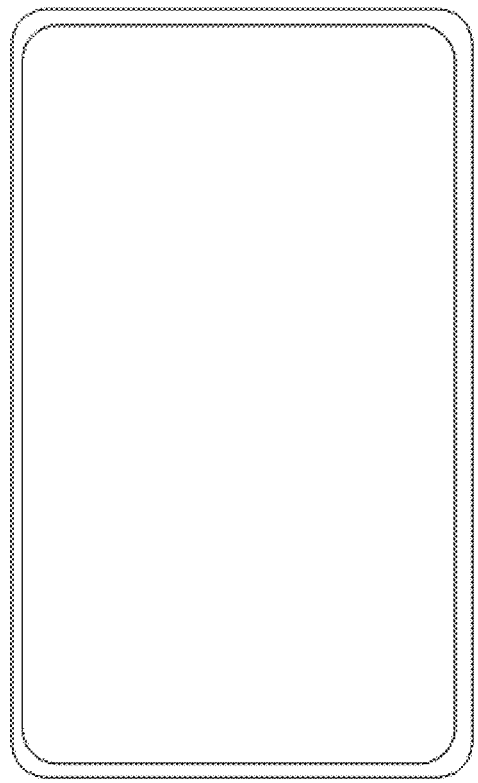
FIG. 10 is a structural schematic diagram of a display device provided by the embodiment of the present disclosure.

In some embodiments, the above display device may be a full-screen mobile phone as shown in FIG. 10. Of course, the above display device provided by the embodiment of the present disclosure may also be any product or component with a display function, such as a tablet computer, a television, a display, a notebook computer, a digital photo frame, a navigator or the like. The ordinary skilled in the art should understand that other essential components of the display device are provided, and they will not be repeated here and should not be taken as a limitation to the present disclosure.

According to the array substrate, the embedded touch screen and the display device provided by some embodiments of the present disclosure, the array substrate includes a base substrate, a touch electrode line located above the base substrate, a touch electrode located above the touch electrode line, and a first insulating layer located between the touch electrode line and the touch electrode; wherein the touch electrode line has a groove portion, the first insulating layer has a via hole, and a connecting portion of the touch electrode extends into the groove portion through the via hole and is electrically connected to the touch electrode line.

By setting the touch electrode line as a structure having the groove portion, the touch electrode is electrically connected to the groove portion of the touch electrode line through the connecting portion, so that the electrical connection joints of the touch electrode and the touch electrode line are further away from the surface of the touch electrode, which can increase the distance between the touch electrode and the electrical connection joints and thus reduce the influence of the electrical connection on the touch electrode, thereby being beneficial to reducing the noise and improving the signal-to-noise ratio and the touch sensitivity of the touch electrode.

It will be apparent that those skilled in the art can make various modifications and variations to the present disclosure without departing from the spirit and scope of the present disclosure. Thus, if such modifications and variations of the present disclosure fall within the scope of the claims of the present disclosure and the equivalent technologies thereof, the present disclosure is also intended to cover such modifications and variations.

What is claimed is:

1. An array substrate, comprising:
    a base substrate;
    a touch electrode line located above the base substrate, wherein the touch electrode line comprises a groove portion;
    a first insulating layer located on the touch electrode line, wherein the first insulating layer comprises a via hole; and
    a touch electrode located on the first insulating layer, wherein the touch electrode comprises a connecting portion, and the connecting portion extends into the groove portion through the via hole and are electrically connected to the touch electrode line.

2. The array substrate according to claim 1, wherein the connecting portion and a side wall of the groove portion are separated by the first insulating layer, and the connecting portion is electrically connected to a bottom of the groove portion.

3. The array substrate according to claim 1, further comprising a second insulating layer located under the touch electrode line, wherein the second insulating layer comprises a groove structure, and a depth of the groove structure is greater than a thickness of the touch electrode line; and the groove portion of the touch electrode line is located in the groove structure.

4. The array substrate according to claim 3, further comprising a thin film transistor located between the second insulating layer and the base substrate, wherein the second insulating layer comprises a planarization layer.

5. The array substrate according to claim 4, wherein the first insulating layer comprises a first passivation layer located on one side of the touch electrode line facing the touch electrode, and a second passivation layer located between the first passivation layer and the touch electrode.

6. The array substrate according to claim 4, further comprising a third passivation layer, wherein the third passivation layer is located between the second insulating layer and the thin film transistor.

7. The array substrate according to claim 4, wherein the second insulating layer further comprises a fourth passivation layer, wherein the fourth passivation layer is located between the planarization layer and the touch electrode line.

8. The array substrate according to claim 3, further comprising a thin film transistor located between the first insulating layer and the base substrate, wherein the touch electrode line is located on a layer same as a layer on which a source and a drain of the thin film transistor are, and the second insulating layer is an interlayer insulating layer between the source and the drain of the thin film transistor and a gate of the thin film transistor.

9. The array substrate according to claim 8, wherein the first insulating layer comprises a first passivation layer, a planarization layer and a second passivation layer that are stacked sequentially between the touch electrode line and the touch electrode.

10. The array substrate according to claim 1, further comprising a common electrode layer, wherein the common electrode layer comprises a plurality of independent common electrodes, and the common electrode is reused as the touch electrode.

11. The array substrate according to claim 10, further comprising a pixel electrode located between the common electrode layer and the touch electrode line, and a lap portion located in the via hole and electrically connected to the connecting portion of the touch electrode; and the lap portion is located on a same layer as a layer on which the pixel electrode is.

12. The array substrate according to claim 1, wherein the touch electrode line comprises a plurality of groove portions, and the touch electrode comprises a plurality of connecting portions matched with the number of the groove portions.

13. The array substrate according to claim 1, wherein the touch electrode is electrically connected to at least two touch electrode lines.

14. The array substrate according to claim 13, wherein the touch electrode lines electrically connected to the touch electrode are electrically connected to one another at a signal input terminal through a touch electrode lead;
    wherein the touch electrode lines electrically connected to the touch electrode are electrically connected to one another at the other end away from the signal input terminal through a connecting line.

15. The array substrate according to claim 13, further comprising auxiliary electrodes located on a layer same as a layer on which the touch electrode lines are, and a plurality of sub-pixel units arranged in an array, wherein the auxiliary electrodes and the touch electrode lines extend in a same direction;
    wherein the auxiliary electrodes are electrically connected to the touch electrode, and the auxiliary electrodes and the touch electrode lines are located at gaps among different sub-pixel units.

16. The array substrate according to claim 15, wherein the touch electrode lines and the auxiliary electrodes electrically connected to the touch electrode are arranged alternately.

17. The array substrate according to claim 15, further comprising a data line, wherein the touch electrode lines and the data line are located on different layers;
    orthographic projections of a touch electrode line and a data line located at a same gap between the sub-pixel units on the base substrate at least partially overlap; and
    orthographic projections of an auxiliary electrode and a data line located at a same gap between the sub-pixel units on the base substrate at least partially overlap.

18. The array substrate according to claim 15, further comprising a plurality of data lines, wherein the touch electrode lines and the data lines are located on a same layer;
    orthographic projections of a touch electrode line and a data line located at a same gap between the sub-pixel units on the base substrate do not overlap with each other; and orthographic projections of an auxiliary electrode and a data line located at a same gap between the sub-pixel units on the base substrate do not overlap with each other.

19. An embedded touch screen, comprising the array substrate according to claim 1.

20. A display device, comprising the embedded touch screen according to claim 19.

* * * * *